(12) United States Patent
Rousset

(10) Patent No.: US 7,944,664 B2
(45) Date of Patent: May 17, 2011

(54) SAFETY DEVICE FOR A SEMICONDUCTOR SWITCH

(75) Inventor: David Rousset, Toulouse (FR)

(73) Assignee: Airbus France, Toulouse (FR)

( * ) Notice: Subject to any disclaimer, the term of this patent is extended or adjusted under 35 U.S.C. 154(b) by 0 days.

(21) Appl. No.: 12/297,882

(22) PCT Filed: Apr. 18, 2007

(86) PCT No.: PCT/EP2007/053756
§ 371 (c)(1),
(2), (4) Date: Apr. 9, 2009

(87) PCT Pub. No.: WO2007/122150
PCT Pub. Date: Nov. 1, 2007

(65) Prior Publication Data
US 2009/0251838 A1    Oct. 8, 2009

(30) Foreign Application Priority Data

Apr. 21, 2006    (FR) .................................... 06 51413

(51) Int. Cl.
*H02H 3/08* (2006.01)
*H02H 9/02* (2006.01)
*H02H 9/08* (2006.01)

(52) U.S. Cl. ...................... 361/93.1; 361/93.7; 361/93.9
(58) Field of Classification Search ................. 361/93.1, 361/93.7, 93.9
See application file for complete search history.

(56) References Cited

U.S. PATENT DOCUMENTS

| 3,878,434 A | 4/1975 | Voorhoeve |
| 5,563,759 A * | 10/1996 | Nadd ............................ 361/101 |
| 6,700,770 B2 * | 3/2004 | Chea, Jr. ....................... 361/119 |
| 7,626,797 B2 * | 12/2009 | Kilroy et al. ................. 361/93.4 |

FOREIGN PATENT DOCUMENTS

| DE | 3622268 C1 | 2/1988 |
| DE | 4000674 A1 | 2/1990 |
| EP | 1583193 A | 10/2005 |
| WO | 02095895 A | 11/2002 |

OTHER PUBLICATIONS

International Search Report dated Jul. 16, 2007.

* cited by examiner

*Primary Examiner* — Dharti H Patel
(74) *Attorney, Agent, or Firm* — Perman & Green, LLP

(57) ABSTRACT

A safety device for a semiconductor switch controlling a secondary line provided with a fuse on the input side of the switch device that includes component to create a short circuit in the secondary line, so as to cut off the fuse, and means of activating this component following detection of an overcurrent in the secondary line.

8 Claims, 1 Drawing Sheet

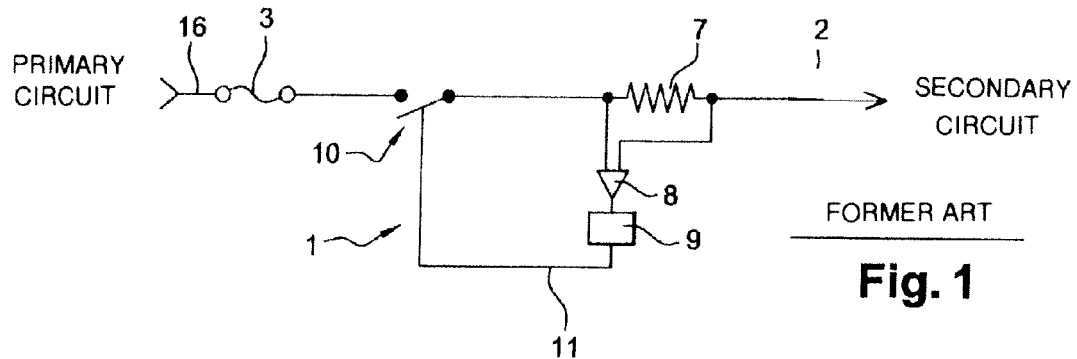
Fig. 1 FORMER ART
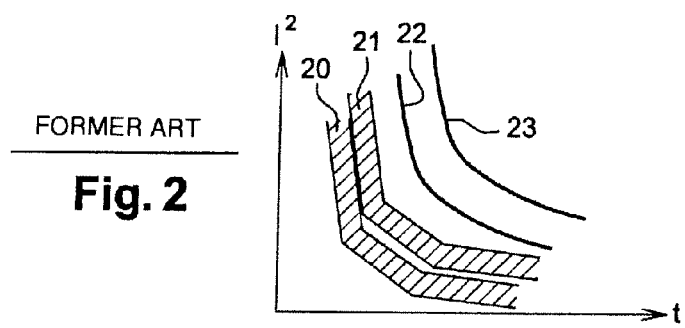
FORMER ART
Fig. 2
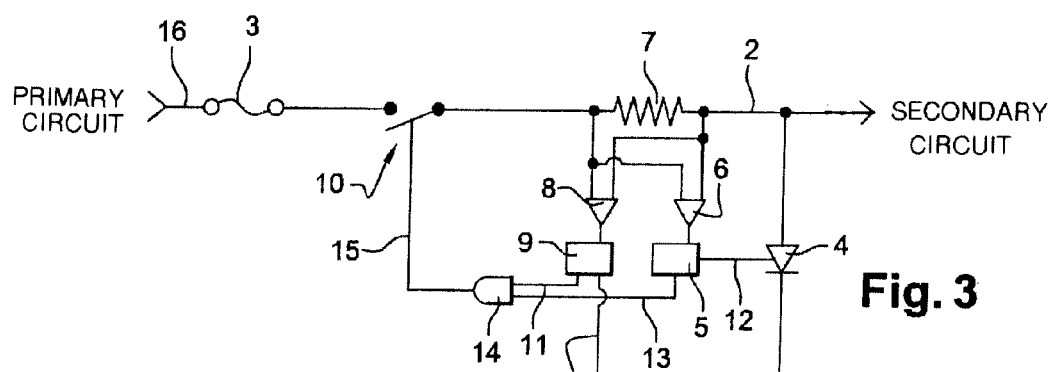
Fig. 3
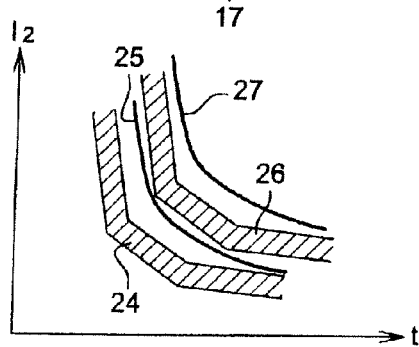
Fig. 4

SAFETY DEVICE FOR A SEMICONDUCTOR SWITCH

CROSS REFERENCE TO RELATED APPLICATIONS

This application is the National Stage of International Application No. PCT/EP2007/053756, International Filing Date, 18 Apr. 2007, which designated the United States of America, and which International Application was published under PCT Article 21 (2) as WO Publication No. WO2007/122150 and which claims priority from French Application No. 0651413, filed on 21 Apr. 2006, the disclosures of which are incorporated herein by reference in their entireties.

BACKGROUND

1. Field

The disclosed embodiments refer to a safety device for a semiconductor switch, used specifically to open or close secondary lines, connected to a primary network and making it possible to obtain power from secondary equipment.

2. Brief Description of Related Developments

Semiconductor switches provide electrical protection making it possible to open the secondary circuits and to protect the secondary network cables in the event of over current in the secondary circuits.

The electrical protection is calibrated to open the switch at a certain calculated value for the $i^2 \cdot t$ current, lower than the smoke curve rating characterizing the cables that are specifically used in aircraft wiring.

These semiconductor switches are generally equipped with a protective electrical circuit, comprising a means to detect the current crossing the secondary line that measures the potential difference at the terminals of a resistance series inserted into the secondary circuit, and, comprising a control circuit for the switch component, measuring the value of the current in the secondary circuit line and activating the switch component in the open circuit in the event of overcurrent exceeding a current threshold defined in the secondary line.

The semiconductor switch is thus equipped with an open-close control command that is automated under normal operation by an external system and with an open command emitted from the protective electric circuit.

A problem encountered in these switches is that their failure mode is generally a short-circuit in the switch component which is usually constituted by a MOS power transistor.

When this type of failure occurs, it is no longer possible to control the secondary line opening which will remove the overcurrent protection and may lead to destructive overheating of the secondary cables in the event of problems with the equipment which might even result in damaging of the primary line.

A known solution is to place a fuse upstream from the semiconductor switch, this fuse being calibrated to cut-off when a threshold value higher than the safety cut-off value for the switch is reached.

The fact remains that in former art, the cut-off of this fuse occurs only in the event of failure of the downstream circuit and, because the characteristics of the fuses are dispersed, with the exception of when the fuse is configured to a rupture value that is much lower than the current capacity of the cable, it cannot be easily guaranteed that the circuit will open at a level of intensity that will not be prejudicial to the cables when the switch is short-circuiting.

Therefore, the cables must be oversized in comparison with the cut-off value of the fuse as well as with the cut-off current of the switch device and the switch device must be also oversized compared to the nominal current of the secondary line in order to reduce the risk of destroying the power transistor.

SUMMARY

The disclosed embodiments concern an improvement in the semiconductor switches, the purpose of which is the creation of a safety device that will ensure the cut-off of the fuse and the protection of a cable that is upstream and downstream from a semiconductor switch in the event of failure of the switch.

With this intention, the disclosed embodiments envisages a safety device, for a semiconductor switch device which controls a secondary line provided with a fuse upstream from the switch device, which comprises a short-circuit component of the secondary line, of the type that will cut-off the fuse, plus the means to activate this component upon detection of an overcurrent in the secondary line.

Other characteristics and advantages of the disclosed embodiments shall become apparent by reading the following description of non-restrictive examples of the disclosed embodiments in reference to the figures which show:

BRIEF DESCRIPTION OF RELATED DEVELOPMENTS

In FIG. 1: A schematic of the switch device of the former art,

In FIG. 2: Time/electrical power curves of the features corresponding to the schematic of FIG. 1, In FIG. 3: A schematic of the switch device supplied with the safety device according to the disclosed embodiments, In FIG. 4: Time/electrical power curves of the features corresponding to the schematic of FIG. 3,

DETAILED DESCRIPTION OF THE DRAWINGS

FIG. 1 shows a switch device used to control a secondary line or circuit (2), including equipment such as known aircraft equipment (not shown), from a primary line or circuit (16).

In a known way, several secondary circuits may be connected in parallel to the primary circuit and the currents consumed by these secondary circuits are accumulated in the primary circuit (16) which results in an increase in the cable section of the primary circuit.

The switch device (1) is preferentially a semiconductor power switch, in the form of a monolithic or hybrid circuit, comprising current protection which is used specifically to protect the secondary circuit cable from overheating due to a current that is too high in the secondary line.

The switch device includes a switch component (10), controlled by a control device comprising a means of control (17) originating from a control unit (not shown) of a machine for example, or, in the case of an aeronautical application, of a control board in the cockpit of an aircraft.

The switch device includes a switch component (10) which may be an analog MOS transistor switch or possibly a relay and a first amplifier and/or a voltage comparator (8) the input side of which is connected to the terminals of a resistance control (7) making it possible to generate a potential difference proportional to the current coursing through the secondary line (2).

This device advantageously includes a first microcontroller (9) which controls the switch component (10), receiving an amplified signal from the first amplifier and/or voltage comparator, and, programmed to commutate the switch component (10) in a closed or open circuit according to the value of the amplified signal, the first microcontroller comprising a control outlet (11) for the switch component (10).

Within the framework of the disclosed embodiments, the first microcontroller may be replaced by a wired logic circuit, the control thresholds and level being then set by resistance values, the comparator giving a logical output signal.

When the threshold for short-circuiting the secondary circuit is reached during an overcurrent, for example, the switch device short-circuits the secondary circuit while passing over the switch component of the state passing into an open state in order to isolate the secondary circuit.

On the other hand if the threshold is exceeded without short-circuiting of the circuit by the switch device, for example in the event the blocked switch component fails in a closed circuit, a fuse (3) is envisaged so that if the current increases beyond the maximum current accepted by fuse 3, the latter will break and insulate the secondary line in the second level of Safety.

In addition to the switch device (1), the secondary line (2) control circuit thus comprises the fuse (3) the rupture threshold of which is calculated to be above the release threshold of the switch device protection and to be below the overheating threshold of the secondary cable even below the overheating threshold of the primary cable.

The curves in FIG. 2, for which the X-coordinate represents time and the ordinate represents the square of the current traversing the switch component and the secondary line, correspond to the illustration of these levels, reference 20 corresponding to the area where the switch device opens, reference 21 corresponds to area where the fuse ruptures, reference 22 corresponds to the $i^2 \cdot t$ characteristic of the secondary line cable (2) and reference 23 is the $i^2 \cdot t$ characteristic of the main line cable (16).

The fuse must be rupture between the opening threshold value of the switch and below any risk of deterioration of the secondary cable.

Because the values of the current of the fuses are dispersed and in order to avoid any risk of overlapping the rupture zone of the fuse and the opening area of the switch device, which could generate a rupture of the fuse before the switch opens, it is necessary to lower the switch detection level which consequently requires the use of an oversize device switch with a line carrying a weaker current and oversizing the associated systems and possibly the cables.

An example of an embodiment of the Safety device is given in FIG. 3.

This safety device, for a semiconductor switch device (1) to control a secondary line (2) provided with a fuse (3) upstream from the switch device, comprises a component (4) for setting up a short-circuit of the secondary line controlled by the switch device.

This component to set up the short-circuit is positioned between the secondary line (2) and a grounded area in order to short-circuit the fuse (3) by generating an overcurrent in the secondary line and at the level of the fuse (3) upon detection of an anomaly.

During normal operation, this component is open.

The safety device includes the means (5, 6, 7) for the short-circuit component (4) to activate upon detection of an overcurrent in the secondary line.

Thus, when an overcurrent is detected the component (4) is put into short-circuit and increases the current even more in order to force and/or accelerate the rupture of the fuse.

According to FIG. 3, the means of activation for the component (4) includes a means of detection (7) for a potential difference at the terminals of the switch device, a means of comparison (6) of this potential difference at a threshold and a means to control (5) the switch component (4) upon detection of surpassing the threshold.

Advantageously, the means of detection consists of a resistance (7) placed in series within the secondary circuit which will create a difference in the potential at its terminals in terms of the current traversing the secondary line (2) and which will control the switch device.

To avoid piling up resistances in the secondary circuit, preferably, the resistance consists of the switch device control resistance already being used to measure the current traversing the secondary line.

Moreover, the circuit which triggers the short circuit includes a second amplifier and/or voltage comparator (6) the input sides of which are connected to the control resistance terminals (7) and, when an intelligent solution is chosen, a second microcontroller (5) to control the component (4) to trigger the short circuit of the line.

The second microcontroller receives an amplified signal from the second amplifier and/or voltage comparator and is programmed to activate the component (4) to trigger the short circuit, depending on the value of the amplified signal surpassing the pre-defined threshold value, through an output side (12) to control the component (4) triggering the short circuit of the line.

Within the framework of the disclosed embodiments, the second microcontroller, like the first microcontroller, may be replaced by a wired logic circuit.

The safety device is calibrated to place the line in short circuit when an overcurrent occurs that is above the highest level of the level of current to activate opening of the secondary circuit by the protection circuit running through the switch (1).

Thus, the safety device will not be activated unless there is a failure in the short circuit of the switch component (10) which in this case will not have been able to cut off the secondary line at the level of the switch's nominal safety current.

As shown in the example, in order to avoid any overlapping between the two systems, the switch device and the safety device, the second microcontroller (5) includes a complementary outlet (13) to control the switch component (10) and the device includes a logical gate (OU 14), inserted between the control outlet (11) of the first microcontroller and a control inlet (15) of the switch component (10), and receives the signals of the complementary outlet (13), to trigger the opening of the switch component upon passing to 1 of the control outlet (11) or the complementary outlet (13).

According to the disclosed embodiments, the component (4) that triggers the short-circuit is preferably a semiconductor switch, namely a thyristor when the secondary circuit is powered by direct current, the potential difference at the switch device terminals being a continuous potential difference, that is to say a triac (bidirectional triode thyristor) in the case of a line being powered by alternating current, the potential difference at the switch device terminals being then an alternating potential difference.

The X-coordinate shown here as well as the time and the ordinate are the square of the current traversing the switch component and the secondary line.

Reference 24 corresponds to the opening zone of the switch device and the closing zone of the component that triggers the short-circuit; reference 25 corresponds to the $i^2 \cdot t$ characteristic of the secondary cable line (2); reference 26 corresponds to the rupture zone of the fuse and reference 27 corresponds to the $i^2 \cdot t$ characteristic of the principal line cable (16).

The $i^2 \cdot t$ short-circuit activation curve of the safety device according to the disclosed embodiments is advantageously defined below the smoke curve rating of the secondary cable and below the $i^2 \cdot t$ rupture curve of the fuse, the rupture curve of the fuse may thus be beyond the smoke curve rating of the secondary cable without risk.

Indeed, as the operation of the safety device, using a thyristor or a triac, is more deterministic than the rupture curve of a fuse, the switch devices used may have a higher $i^2 \cdot t$ curve, which may approach that of the secondary cable.

The opening zone of the fuse may then be raised to above the secondary cable specifications because the rupture of the fuse, following the generation of the short-circuit by the component (4), is quick enough to avoid prejudicial heating of the secondary circuit cable.

The device according to the disclosed embodiments thus makes it possible to use semiconductor power switches on systems functioning at currents which are higher than those that do not have them, and avoids oversizing the power components of this type of switch.

Within the framework of the disclosed embodiments, only one microcontroller and only one amplifier and/or voltage comparator may be used and shared for the switch device and the safety device but a redundant solution such as that described is favored in order to avoid any problems when simple breakdown occurs.

The use of only one resistance remains however preferred in order to avoid increasing the losses on the line and owing to the fact that a failure of this type of component leads to an open circuit rather than with a short-circuit.

The power/time curves of the various components of a circuit according to the disclosed embodiments are shown in FIG. 4.

The invention claimed is:

1. A safety device, for a semiconductor switch device which controls a secondary line provided with a fuse upstream from the semiconductor switch device, wherein said safety device comprises:
   a short-circuit component of the secondary line configured to cut-off the fuse; and
   a means of activation of said short-circuit component upon detection of an over-current in the secondary line, wherein said means of activation includes:
      a means of detection of a potential difference at the terminals of the semiconductor switch device,
      a means of comparison of this potential difference with a threshold; and
      a means to control the short circuit component upon detection of surpassing the threshold,
      wherein said means of activation of said short circuit component is calibrated to place the secondary line in short circuit when an over-current occurs that is above a highest level of current for activating opening of the secondary line by said semiconductor switch device.

2. A safety device according to claim 1 for which the means of detection are a resistance to control the semiconductor switch device.

3. A safety device according to claim 2 wherein the semiconductor switch device includes:
   a first amplifier or voltage comparator at the terminals of said resistance;
   a first microcontroller comprising a control outlet side of a switch component, and configured to control the switch component, the first microcontroller configured for receiving an amplified signal from the first amplifier or voltage comparator and programmed to commutate the switch component according to the value of the amplified signal;
   a circuit comprising a second amplifier and/or voltage comparator at the terminals of said resistance, and configured to trigger the short circuit component; and
   a second microcontroller configured to control the short circuit component to trigger the short circuit on the secondary line, the second microcontroller configured to receive an amplified signal from the first amplifier or voltage comparator and programmed to activate the short circuit component to trigger the short circuit of the secondary line depending on the value of the amplified signal,
   the second microcontroller including a control outlet side of the short circuit component that triggers the short circuit on the secondary line.

4. A safety device according to claim 3 wherein:
   the second microcontroller includes a complementary outlet to control the switch component, and wherein
   the safety device includes a logical gate (OR), inserted between the control outlet of the first microcontroller and a control inlet of the switch component, and is configured to receive the signals of the complementary outlet to trigger the opening of the switch component upon passing to one of the control outlet or the complementary outlet.

5. A safety device according to claim 1, wherein the short-circuit component that triggers the short circuit on the secondary line is a semiconductor commutator.

6. A safety device according to claim 5, wherein the semiconductor commutator is a thyristor, and wherein the difference in potential at the terminals of the semiconductor switch device is a direct current potential difference.

7. A safety device according to claim 5, wherein the semiconductor commutator is a triac, and wherein the difference in potential at the terminals of the semiconductor switch device is an alternating current potential difference.

8. A safety device according to claim 1 wherein the safety device short circuit $i^2 \cdot t$ activation curve is defined below the smoke curve rating of the secondary cable and below the $i^2 \cdot t$ rupture curve of the fuse.

* * * * *